United States Patent
Mimuro

(10) Patent No.: US 6,469,351 B1
(45) Date of Patent: Oct. 22, 2002

(54) ELECTROSTATIC BREAKDOWN PREVENTION CIRCUIT FOR SEMICONDUCTOR DEVICE

(75) Inventor: Yoichi Mimuro, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/323,505

(22) Filed: Jun. 1, 1999

(30) Foreign Application Priority Data

Jun. 2, 1998 (JP) .......................................... 10-153372

(51) Int. Cl.[7] .............................................. H01L 23/62
(52) U.S. Cl. ...................... 257/355; 257/357; 257/364; 257/369; 257/371; 257/412; 257/413; 438/200; 361/56; 361/111; 357/42
(58) Field of Search ................................. 257/355, 407, 257/357, 364, 369, 371, 412, 413, 406; 361/111, 56; 357/42; 438/200

(56) References Cited

U.S. PATENT DOCUMENTS

| | | | | |
|---|---|---|---|---|
| 4,042,945 A | * | 8/1977 | Lin et al. ..................... 257/406 |
| 5,021,853 A | * | 6/1991 | Misty ........................... 357/42 |
| 5,159,518 A | * | 10/1992 | Roy .............................. 361/56 |
| 5,386,135 A | * | 1/1995 | Nalazato et al. ............. 257/369 |
| 5,532,178 A | * | 7/1996 | Liaw et al. .................. 438/200 |
| 5,615,073 A | * | 3/1997 | Fried et al. ................... 361/56 |
| 5,783,850 A | * | 7/1998 | Liau et al. ................... 257/355 |
| 6,128,226 A1 | * | 4/2001 | Lin et al. ..................... 438/200 |
| 6,249,413 B1 | * | 6/2001 | Duvvury ...................... 361/111 |

OTHER PUBLICATIONS

S. Wolf, Silicon Processing for the VLSI Era, vol. 2, pp 302.*

* cited by examiner

Primary Examiner—Matthew Smith
Assistant Examiner—Belur V Keshavan
(74) Attorney, Agent, or Firm—Adams & Wilks

(57) ABSTRACT

A Vss-side off transistor is often used in an electrostatic breakdown prevention circuit having an NMOS transistor. In such a circuit, the state of connection of the transistor ensures that off-leak current has a significant influence on the standby current, which is particularly noticeable when the circuit is used in a semiconductor device running at low power consumption. In such case, since the threshold voltage of a MOS transistor forming the semiconductor device is made as low as possible, the sub-threshold leak current in the electrostatic breakdown prevention circuit is large. To prevent this, the NMOS transistor forming the electrostatic breakdown prevention circuit is formed with a P type gate electrode for the purpose of increasing its threshold voltage by about 1.1 V as compared with that if the gate electrode of the NMOS transistor were to have an N type gate electrode.

17 Claims, 3 Drawing Sheets

ELECTROSTATIC BREAKDOWN PREVENTION CIRCUIT FOR SEMICONDUCTOR DEVICE

BACKGROUND OF THE INVENTION

The present invention relates generally to an electrostatic breakdown prevention circuit for a semiconductor device, and more particularly, to an electrostatic breakdown prevention circuit using a MOS transistor.

Conventionally, an electrostatic breakdown prevention circuit using a MOS transistor is widely utilized. Its basic structure is generally such that an NMOS transistor is connected on the side of, normally, VSS so as to be connected in parallel with an input terminal. FIG. 4(a) shows an example of an electrostatic breakdown prevention circuit connected with VSS 200. In this case, when electrostatic stress is applied to an input terminal 202, avalanche breakdown is caused at a drain terminal of an NMOS transistor 201 connected to an input terminal of an internal circuit 203, and due to a so-called snap-back phenomenon, a parasitic bipolar transistor formed of a source, a substrate, and a drain, as shown in FIG. 4(b) is turned on. This has a protecting effect, and thus, functions as an electrostatic breakdown prevention circuit.

When a semiconductor device including an internal circuit is manufactured, N type polysilicon with phosphorus as the impurity is normally used as a gate electrode of the above-mentioned NMOS transistor. Since current driveability at a certain level is required, a channel (W) length has to be several hundreds of μm.

However, particularly in the case where the semiconductor device is intended to have low power consumption, an off-leak current in a subthreshold region generated in the NMOS transistor of the electrostatic breakdown prevention circuit is a cause of an increase in the standby current of the semiconductor device. In other words, operation at a lower voltage is required to attain a lower power consumption. However, in order to attain this, the threshold voltage of a MOS transistor forming the semiconductor device has to be set at a lower level. If the threshold voltage of the NMOS transistor forming the electrostatic breakdown prevention circuit is lowered similarly, together with the large W length, this leads to a remarkable increase in the leak current. Since the threshold voltage of the NMOS transistor forming the electrostatic breakdown prevention circuit does not have direct influence on the operation of the semiconductor device, the problem is solved by setting the threshold voltage of the NMOS transistor higher than that of the MOS transistor forming the semiconductor device. However, additional photolithography processes are necessary for this, which results in an increase in the number of processes.

SUMMARY OF THE INVENTION

Means adopted by an electrostatic breakdown prevention circuit for a semiconductor device according to the present invention in order to attain the above-mentioned object is to provide a P type gate for an NMOS transistor forming the electrostatic breakdown prevention circuit. This structure utilizes the energy gap in the gate electrode to increase its threshold voltage by about 1.1V higher than the threshold voltage in the case where the gate were of the N type.

DETAILED DESCRIPTION OF THE INVENTION

An electrostatic breakdown prevention circuit for a semiconductor device according to the present invention can be applied to a semiconductor device adapted to have low power consumption without increasing the number of manufacturing processes.

An embodiment of the present invention will be described in the following with reference to the drawings.

Figure 1A:
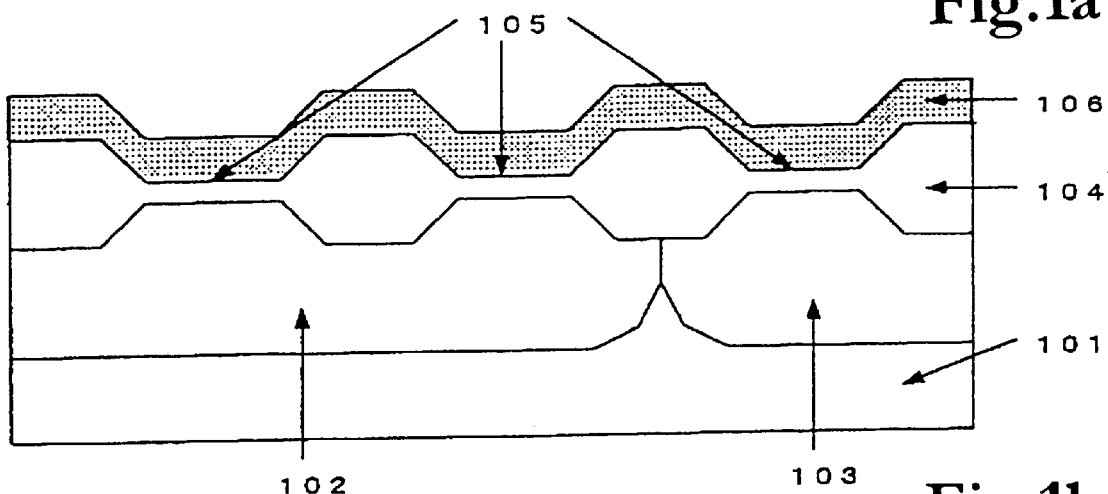
FIGS. 1a–1c are sectional views of a manufacturing process illustrating an embodiment of a semiconductor device according to the present invention.
Figure 1B:
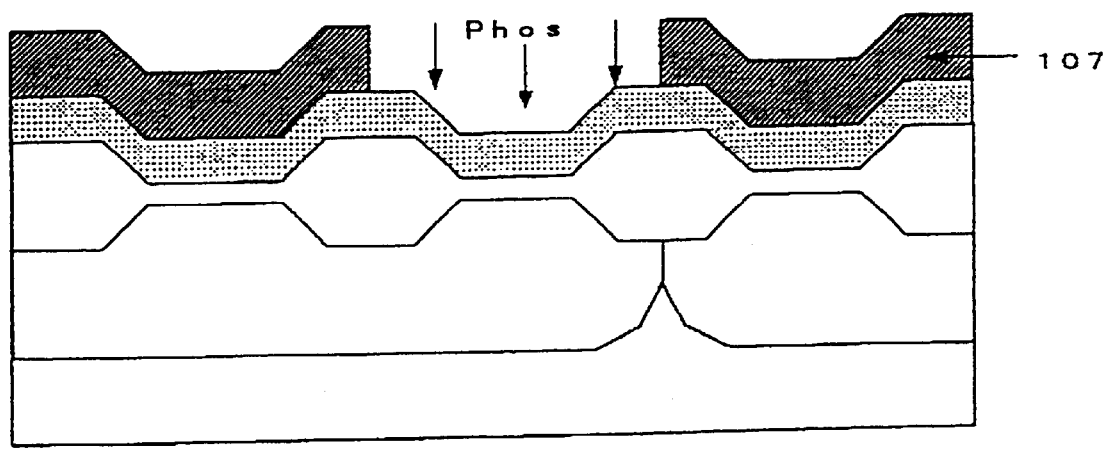
Figure 1C:
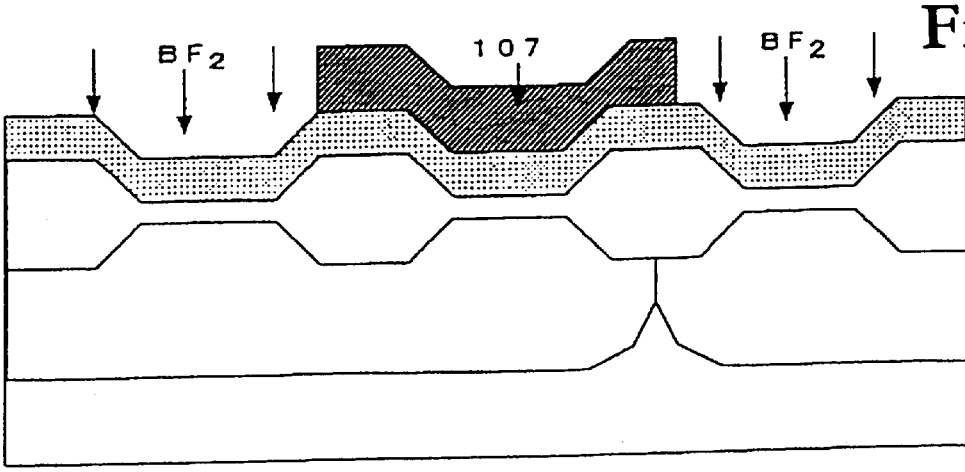

FIGS. 1a–1c are sectional views illustrating an embodiment of a manufactured process according to the present invention.

First, as shown in FIG. 1(a), P wells and N wells 102,103 are formed one by one on a P type silicon substrate 101, and respective NMOS transistors and PMOS transistors are isolated by a field oxide film 104. Then, a polysilicon film 106 to be used as gate electrodes is formed on the entire surface of the substrate. In this figure, two NMOS transistors are shown, one of which is a transistor forming an internal circuit of a semiconductor device and the other of which is a transistor forming an electrostatic breakdown prevention circuit.

Next, as shown in FIG. 1(b), a photoresist layer 107 is deposited and opened only with regard to a portion where the NMOS transistor forming the internal circuit of the semiconductor device is formed, and phosphorus is doped by ion implantation. This is done in order to make an N type gate electrode of the NMOS transistor.

Then, as shown in FIG. 1(c), a photoresist layer 107 is deposited and opened only with regard to a portion where a PMOS transistor forming the internal circuit of the semiconductor device is formed and with regard to a portion where the NMOS transistor forming the electrostatic breakdown prevention circuit formed, and $BF_2$ is doped by ion implantation. This is done in order to a make a P type gate 111 of the transistors.

Figure 2A:
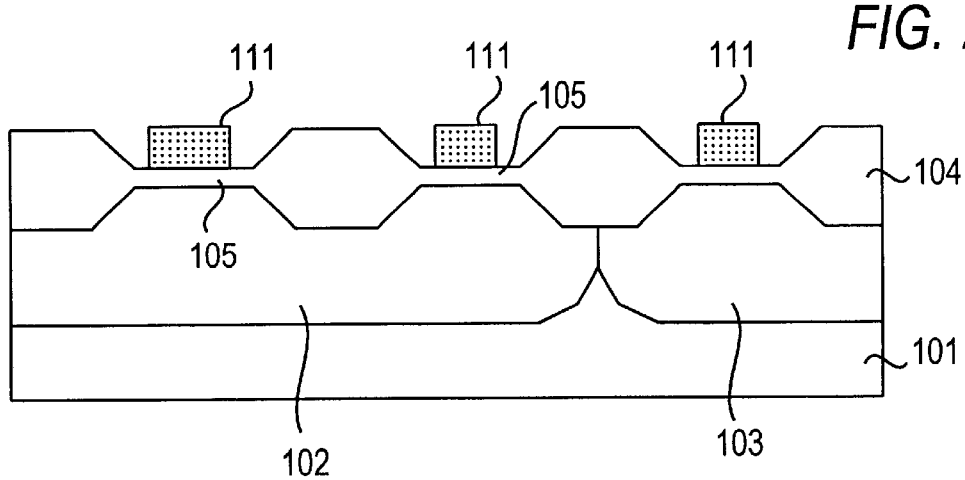
FIGS. 2a–2c are sectional views of the manufacturing process subsequent to FIG. 1.

Next, as shown in FIG. 2(a), polysilicon is patterned by lithography and is etched to be removed except for desired areas.

Figure 2B:
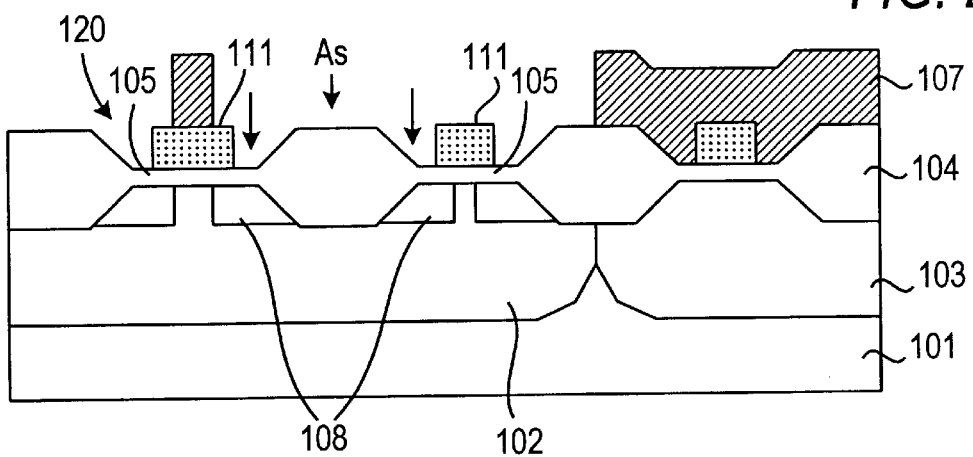

Then, as shown in FIG. 2(b), a photoresist layer 107 is opened with regard to a portion where the NMOS transistor forming the internal circuit of the semiconductor device is formed and with regard to a portion where the NMOS transistor forming the electrostatic breakdown prevention circuit is formed except for its gate portion, and arsenic is doped by ion implantation. Here, lithography is carried out such that the photoresist remains on the gate of the NMOS transistor forming the electrostatic breakdown prevention circuit. The size has to be determined taking into consideration its minimum line width and alignment accuracy.

Figure 2C:
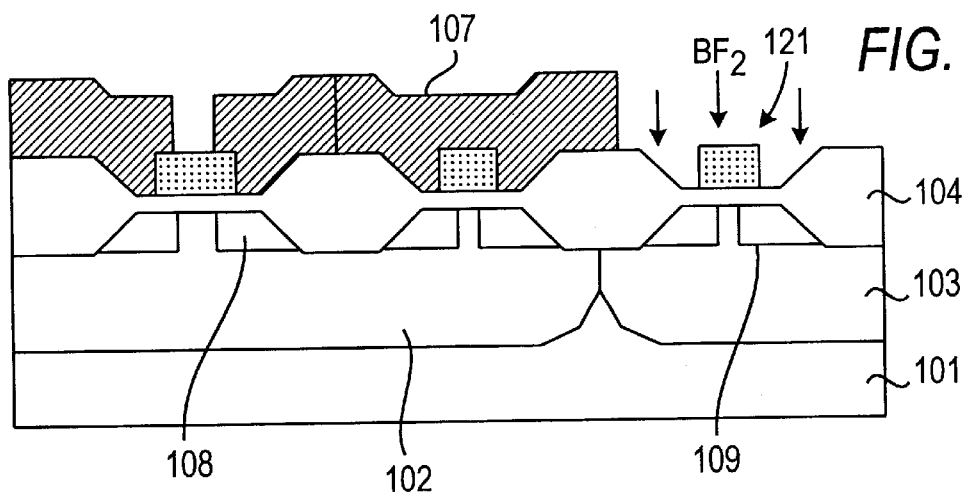

Then, as shown in FIG. 2(c), after the photoresist applied in FIG. 2(b) is removed, a photoresist layer 107 is opened with regard to the portion where the PMOS transistor forming the internal circuit of the semiconductor device is formed and with regard to a portion above the gate of the NMOS transistor forming the electrostatic breakdown prevention circuit, and $BF_2$ is doped by ion implantation. Here, similarly to the description with reference to FIG. 2(b), when lithography is carried out such that the photoresist is opened above the gate of the NMOS transistor forming the electrostatic breakdown prevention circuit, the size has to be determined taking into consideration its minimum space and alignment accuracy.

Figure 3:
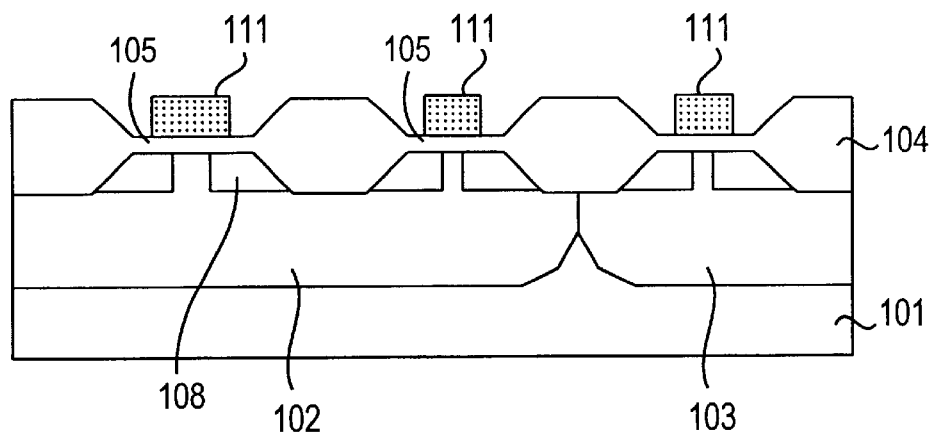
FIG. 3 is a sectional view of the manufacturing process subsequent to FIG. 2C.
Figure 4A:
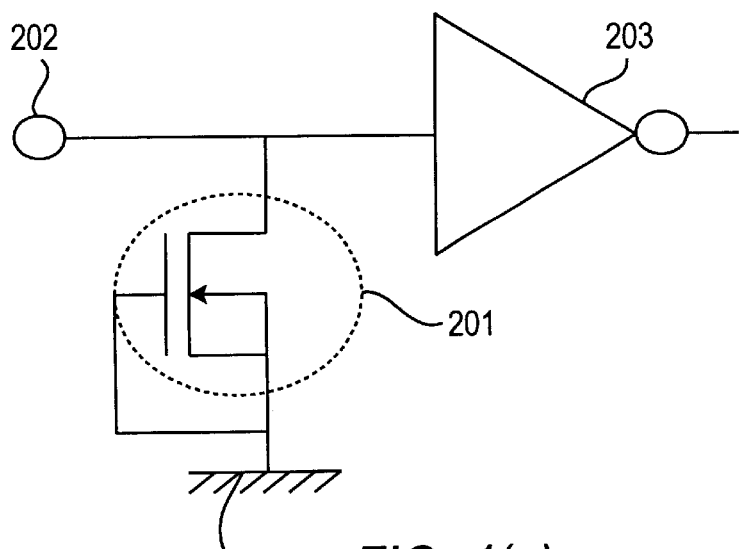
FIGS. 4a and 4b illustrates a conventional electrostatic breakdown prevention circuit using an NMOS transistor.
Figure 4B:
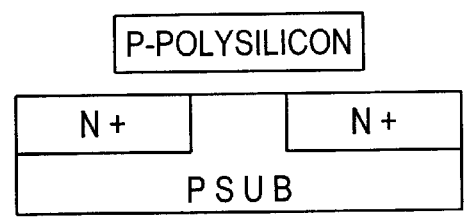

Finally, as shown in FIG. 3, the photoresist applied in FIG. 2(c) is removed. After that, an interlayer insulating film and metal wiring (not illustrated) are formed to connect the respective transistors.

Though the above-mentioned embodiment is a transistor of a so-called single-drain structure, it may be an LDD (Lightly Doped Drain) structure. In this case, after the polysilicon is patterned as in FIG. 2(a), side walls are formed, and $BF_2$ for a PMOS transistor area with photoresist which is opened above the PMOS transistor area and phosphorus for an NMOS transistor area with photoresist which is opened above the PMOS transistor area are doped in the PMOS and NMOS transistors, respectively. If the dose of the phosphorous ion implantation for forming the LDD structure is on the order of $5e13/cm^2$, phosphorus may be doped on the gate of the NMOS transistor forming the electrostatic breakdown prevention circuit.

Further, the gate structure may be a so-called polycide structure. In this case, after polysilicon is formed on the entire surface of the substrate and phosphorus and $BF_2$ are doped one by one by ion implantation, metal having a high melting point such as tungsten silicide is formed on the entire surface of the substrate. After that, similarly to FIG. 2(a), etching is carried out for removal.

As described above, according to the present invention, since a gate electrode of an NMOS transistor of an electrostatic breakdown prevention circuit is formed of P type polysilicon, a threshold voltage which is higher by about 1.1 V than the threshold of an NMOS transistor inside a semiconductor device can be obtained. By this, even though the threshold of the transistor inside the semiconductor device is lowered for the purpose of obtaining a lower power consumption and operation at lower voltage, off-leak current in a subthreshold region of the NMOS transistor of the electrostatic breakdown prevention circuit is negligibly small, and thus, an increase in the standby current of the semiconductor device is remarkably suppressed.

Further, since the polarity of a gate electrode is set simply by a lithography mask and conventional ion implantation is used, no additional photolithography process is necessary. Therefore, an increase in the standby current of the semiconductor device due to leak current of the NMOS transistor of the electrostatic breakdown prevention circuit can be suppressed without increasing the number of manufacturing processes.

What is claimed is:

1. An electrostatic breakdown prevention circuit for a semiconductor device having an internal circuit comprised of an input terminal, an NMOS transistor and a PMOS transistor, the electrostatic breakdown prevention circuit comprising: an NMOS transistor connected between the input terminal and a reference potential and having a P-type polysilicon gate electrode.

2. An electrostatic breakdown prevention circuit for a semiconductor device according to claim 1; wherein the NMOS transistor comprising the electrostatic breakdown protection circuit has a polycide gate structure.

3. An electrostatic breakdown prevention circuit for a semiconductor device according to claim 1; wherein the NMOS transistor comprising the electrostatic breakdown protection circuit has a lightly doped drain structure.

4. An electrostatic breakdown prevention circuit for a semiconductor device according to claim 1; wherein the NMOS transistor comprising the electrostatic breakdown protection circuit is responsive to an applied electrostatic stress to flow an avalanche breakdown at a drain terminal thereof and to undergo a snap-back during which a bipolar operation is performed by said NMOS transistor.

5. An electrostatic breakdown prevention circuit for a semiconductor device according to claim 1; wherein the reference potential comprises ground potential.

6. An electrostatic breakdown prevention circuit for a semiconductor device comprising: an NMOS transistor having a P type gate electrode; and an external connection terminal connected to the NMOS transistor.

7. An electrostatic breakdown prevention circuit according to claim 6; wherein the NMOS transistor has a polycide gate structure.

8. An electrostatic breakdown prevention circuit according to claim 6; wherein the NMOS transistor has a lightly doped drain structure.

9. An electrostatic breakdown prevention circuit according to claim 6; wherein the NMOS transistor is responsive to an applied electrostatic stress to flow an avalanche breakdown at a drain terminal thereof and to undergo a snap-back during which a bipolar operation is performed by the MOS transistor.

10. An electrostatic breakdown prevention circuit according to claim 6; wherein the NMOS transistor is connected as a protective element to a semiconductor device comprising a MOS transistor.

11. An electrostatic breakdown prevention circuit according to claim 6; wherein the NMOS transistor is connected to a low potential terminal to provide a path for an applied electrostatic pressure.

12. An electrostatic breakdown prevention circuit for a semiconductor device having an internal circuit formed of an input terminal and MOS transistors including an NMOS transistor and PMOS transistor pair connected to the input terminal, the electrostatic breakdown prevention circuit comprising: a MOS protection transistor having a first conductivity type and having a gate electrode formed with a second conductivity type opposite that of the first conductivity type, the MOS protection transistor being connected between the input terminal and a reference potential.

13. An electrostatic breakdown prevention circuit according to claim 12; wherein the MOS protection transistor comprises an NMOS transistor having a P-type gate electrode.

14. An electrostatic breakdown prevention circuit according to claim 12; wherein the MOS protection transistor has a lightly doped drain structure.

15. An electrostatic breakdown prevention circuit according to claim 12; wherein the MOS protection transistor is an NMOS transistor that is responsive to an applied electrostatic stress to flow an avalanche breakdown at a drain terminal thereof and to undergo a snap-back during which a bipolar operation is performed by the MOS protection transistor.

16. An electrostatic breakdown prevention circuit according to claim 12; wherein the MOS protection transistor has a polycide gate structure.

17. An electrostatic breakdown prevention circuit according to claim 12; wherein the reference potential comprises ground potential so that the MOS protection transistor is connected to provide a path for an applied electrostatic pressure.

* * * * *